United States Patent
Hoeld (12) 
(10) Patent No.: US 6,487,246 B1
(45) Date of Patent: Nov. 26, 2002

(54) METHOD AND APPARATUS FOR PROGRAMMABLE PULSE WIDTH MODULATED SIGNAL GENERATION WITH PERIOD AND DUTY CYCLE VALUES UPDATED WITH CONTROLLED RELATIVE TIMING

(75) Inventor: Wolfgang K. Hoeld, Moorenweis (DE)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/288,280

(22) Filed: Apr. 8, 1999

(51) Int. Cl.$^7$ ................................................ H03K 9/08
(52) U.S. Cl. .................................. 375/238; 332/109
(58) Field of Search ........................ 375/238; 332/238; 370/212

(56) References Cited

U.S. PATENT DOCUMENTS

| | | | | |
|---|---|---|---|---|
| 4,178,549 A | * | 12/1979 | Ledenbach et al. .... | 340/825.69 |
| 5,144,265 A | * | 9/1992 | Petzold ................. | 144/144.51 |
| 5,589,805 A | * | 12/1996 | Zuraski et al. .............. | 318/599 |
| 6,064,646 A | * | 5/2000 | Shal et al. .................. | 370/212 |
| 6,157,671 A | * | 12/2000 | Young ......................... | 329/312 |
| 6,226,324 B1 | * | 5/2001 | Allstrom .................... | 332/109 |

* cited by examiner

*Primary Examiner*—Stephen Chin
*Assistant Examiner*—Kevin Kim
(74) *Attorney, Agent, or Firm*—Girard & Equitz LLP (57) ABSTRACT

An apparatus for and method of generating a signal having a programmable period and a programmable duty cycle. The apparatus includes an update sequencer circuit. The update sequencer circuit is configured to detect an updated period value and an updated duty cycle value, and to receive a period match signal, and in accordance therewith selectively generate a period write signal and a duty cycle write signal. A storage element is configured to receive the updated period value, the updated duty cycle value, the period write signal, and the duty cycle write signal, and in accordance therewith replace a period value with the updated period value and a duty cycle value with the updated duty cycle value. The update sequencer circuit eliminates the requirement for associated software to have a polling loop or an interrupt.

12 Claims, 4 Drawing Sheets

METHOD AND APPARATUS FOR PROGRAMMABLE PULSE WIDTH MODULATED SIGNAL GENERATION WITH PERIOD AND DUTY CYCLE VALUES UPDATED WITH CONTROLLED RELATIVE TIMING

BACKGROUND OF THE INVENTION

1. Field of the Invention

The present invention relates to pulse width modulation (PWM) signal generators. In particular, the invention relates to PWM signal generators with a programmable period and duty cycle.

2. Description of the Related Art

Pulse width modulation (PWM) signal generator circuits are used in many kinds of circuits, including embedded controllers and motor control circuits.

Figure 1:
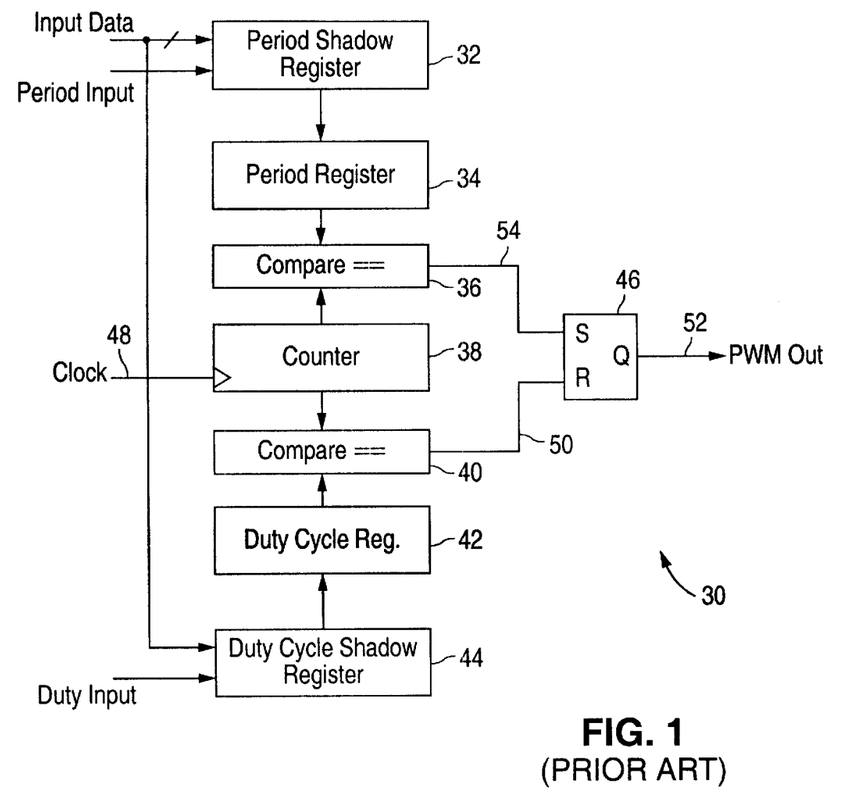
FIG. 1 is a block diagram of an existing PWM timer circuit.

FIG. 1 is a block diagram of an existing PWM timing circuit 30, including a period shadow register 32, a period register 34, a period comparison circuit 36, a counter 38, a duty cycle comparison circuit 40, a duty cycle register 42, a duty cycle shadow register 44, and a set-reset latch 46.

Period register 34 stores a period value and duty cycle register 42 stores a duty cycle value. Counter 38 increments a count value on pulses of a clock signal 48. When the count value equals the duty cycle value (called a "duty cycle match"), duty cycle comparison circuit 40 generates a duty cycle match signal 50, causing set-reset latch 46 to reset an output signal 52. Then, when the count value equals the period value (called a "period match"), period comparison circuit 36 generates a period match signal 54, causing set-reset latch 46 to set the output signal 52 back to its original state. Also at that time, the count value is reset, an updated period value is loaded from the period shadow register 32 into the period register 34, and an updated duty cycle value is loaded from the duty cycle shadow register 44 into the duty cycle register 42.

A computer program generates the updated period value and updated duty cycle value, and also generates a write data signal to indicate to the shadow registers 32 and 44 that they should load the updated values.

In this manner, the output signal 52 is a pulse width modulated signal with a programmable period as determined by the updated period value and a programmable duty cycle as determined by the updated duty cycle value.

Figure 2:
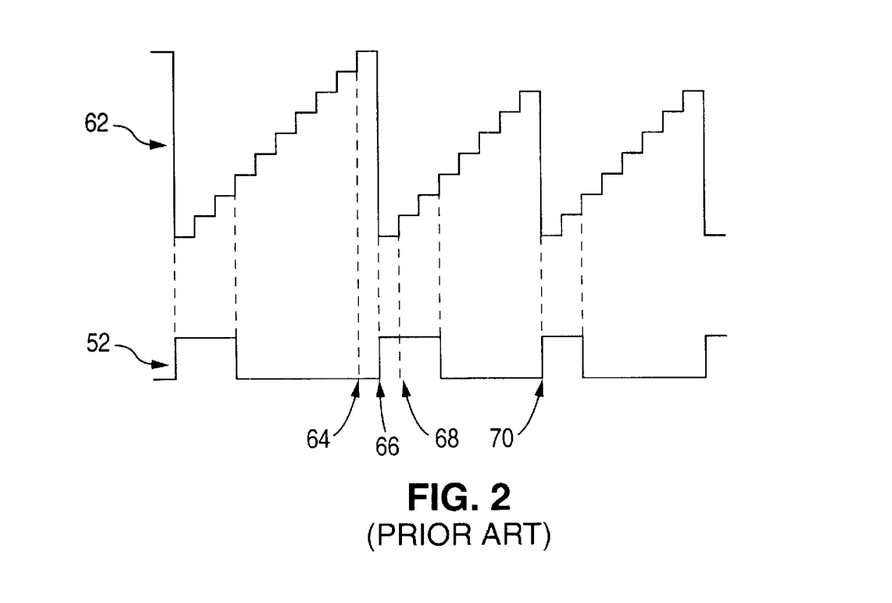
FIG. 2 is a timing diagram illustrating an operational example of the timer circuit of FIG. 1.

FIG. 2 illustrates a potential problem with PWM timing circuit 30 using a specific example. Line 62 corresponds to the count value. Initially, the period value is ten and the duty cycle value is three, so the output signal 52 corresponds to these values. At time 64, the updated period value of eight is written into period shadow register 32. At time 66, the count value matches the period value, so the period value is replaced by the updated period value in period register 34 and the count value is reset. At time 68, the updated duty cycle value of two is written into duty cycle shadow register 44. However, the output signal 52 uses the current duty cycle value of three, instead of the updated duty cycle value of two, until time 70 (the next period match).

Thus, a predictable output signal does not result when the period and duty cycle are updated, unless both can be updated before the period match.

A related concern is that the minimum period value is determined by the maximum time the software requires to update the period and duty cycle shadow registers 32 and 44.

A potential solution is for the software to monitor the count value and to allow updates of the period value and duty cycle value to occur only when both can be accomplished before the period match. Some existing programs include a polling loop or an interrupt to monitor the count value. However, these extra software features increase the load on the processor that runs the software. These concerns are increased when the software controls more than one embedded system, each having its own count value that requires monitoring. Thus, there is a need for a solution that reduces the processor load.

SUMMARY OF THE INVENTION

The present invention addresses these and other problems of existing PWM signal generator circuits by providing an update sequencer circuit.

According to one embodiment, an apparatus according to the present invention includes a pulse width modulation (PWM) timing circuit for generating a signal having a programmable period and a programmable duty cycle. The apparatus includes a storage element, a counter, a comparison circuit, and an update sequencer circuit. The storage element is configured to store at least a period value and a duty cycle value. The counter is configured to receive a clock signal and in accordance therewith generate a count value. The comparison circuit is coupled to the storage element and the counter. The comparison circuit is configured to compare the count value, the period value, and the duty cycle value, and in accordance therewith generate a period match signal and an output signal. The update sequencer circuit is coupled to the storage element and the comparison circuit. The update sequencer circuit is configured to detect an updated period value and an updated duty cycle value, and to receive the period match signal, and in accordance therewith selectively generate a period write signal and a duty cycle write signal. The storage element is further configured to receive the updated period value, the updated duty cycle value, the period write signal, and the duty cycle write signal, and in accordance therewith replace the period value with the updated period value and the duty cycle value with the updated duty cycle value.

According to another embodiment, a method according to the present invention generates a signal having a programmable period and a programmable duty cycle. The method includes the steps of storing at least a period value and a duty cycle value; receiving a clock signal; generating a count value in response to said clock signal; comparing the count value, the period value, and the duty cycle value, and in accordance therewith generating a period match signal and an output signal; detecting an updated period value and an updated duty cycle value; generating a period write signal and a duty cycle write signal in accordance with the updated period and duty cycle values; and replacing the period value with the updated period value and the duty cycle value with the updated duty cycle value.

DETAILED DESCRIPTION OF THE PREFERRED EMBODIMENTS

Figure 3:
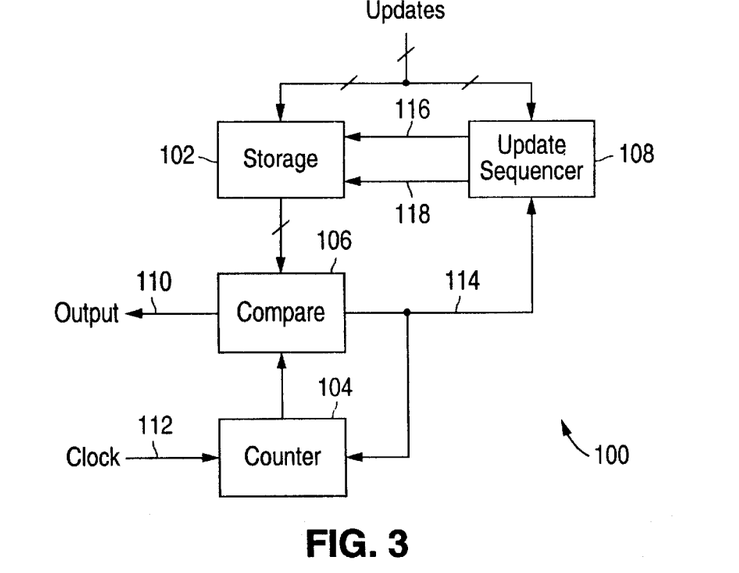
FIG. 3 is a block diagram of a PWM timer circuit according to one embodiment of the present invention.

FIG. 3 is a block diagram of the PWM timing circuit 100 according to one embodiment of the present invention, including a storage element 102, a counter 104, a comparison circuit 106, and an update sequencer circuit 108. The PWM timing circuit 100 generates an output signal 110 having a programmable period and a programmable duty cycle.

The storage element 102 is configured to store at least a period value and a duty cycle value. Preferably storage element 102 includes four registers to store respectively the current period value, the updated period value, the current duty cycle value, and the updated duty cycle value, as with existing PWM timer circuits (e.g., as shown in FIG. 1). However, these values may also be stored in defined locations within one storage element.

Counter 104 is configured to receive a clock signal 112 and a period match signal 114. Counter 104 generates and stores a count value based on pulses of clock signal 112. Preferably counter 104 increments on each pulse of clock signal 112, and resets to zero on a period match (as indicated by the period match signal 114).

Comparison circuit 106 is configured to compare the count value, the period value, and the duty cycle value. When the count value matches the period value, comparison circuit 106 generates the period match signal 114. Comparison circuit 106 is also configured to generate output signal 110 based on duty cycle matches and the period matches.

Update sequencer circuit 108 is configured to detect an updated period value and an updated duty cycle value. More specifically, when the software provides these updated values to storage element 102, this is so indicated to the update sequencer 108. Update sequencer 108 is also configured to receive period match signal 114. Update sequencer selectively generates a period write signal 116 and a duty cycle write signal 118. The specifics of the update sequencer are more fully discussed with reference to FIGS. 4–7.

Storage element 102 is further configured to receive the updated period value, the updated duty cycle value, period write signal 116, and duty cycle write signal 118. Storage element 102 replaces the period value with the updated period value when it receives period write signal 116, and it replaces the duty cycle value with the updated duty cycle value when it receives duty cycle write signal 118.

Figure 4:
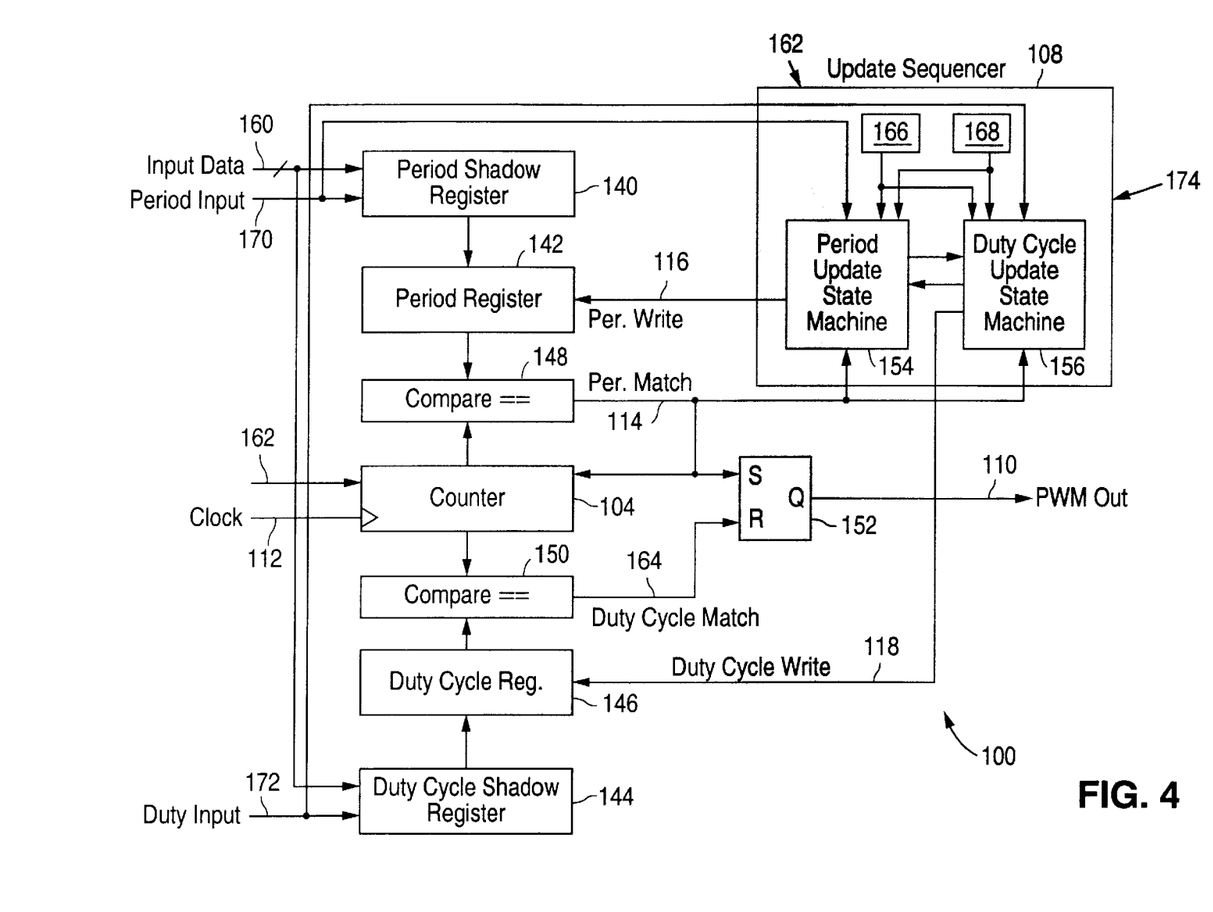
FIG. 4 is a block diagram showing more detail of the PWM timer circuit of FIG. 3.

FIG. 4 shows more detail of PWM timing circuit 100. Storage element 102 (see FIG. 3) includes a period shadow register 140, a period register 142, a duty cycle shadow register 144, and a duty cycle register 146. Comparison circuit 106 (see FIG. 3) includes a period comparison circuit 148, a duty cycle comparison circuit 150, and a set-reset latch 152. Update sequencer circuit 108 (see FIG. 3) includes a period update circuit 154 and a duty cycle update circuit 156.

Period shadow register 140 is configured to receive the updated period value. Preferably the updated period value is received via an input data signal 160 as indicated by a period input signal 170. Period shadow register 140 is configured to store the updated period value upon indication by the period input signal 170. In this manner the period value previously stored in the period shadow register 140 is replaced by the updated period value.

Period register 142 is configured to store the period value, and to receive the updated period value from the period shadow register 140 and the period write signal 116. The period register 142 is configured to replace the period value with the updated period value upon indication by the period write signal 116.

Duty cycle shadow register 144 is configured to receive the updated duty cycle value. Preferably the updated duty cycle value is received via the input data signal 160 as indicated by a duty cycle input signal 172. Duty cycle shadow register 144 is configured to store the updated duty cycle value upon indication by the duty cycle input signal 172. (Alternatively, duty cycle shadow register 144 may instead receive the updated duty cycle value from a different input data signal instead of from the same input data signal 160 that carries the updated period value.)

Duty cycle register 146 is configured to store the duty cycle value, and to receive the updated duty cycle value from the duty cycle shadow register 144 and the duty cycle write signal 118. The duty cycle register 146 is configured to replace the duty cycle value with the updated duty cycle value upon indication by the duty cycle write signal 118.

Counter 104 may be further configured to receive (in addition to clock signal 112 and period match signal 114) a timer signal 162, and in accordance therewith selectively count pulses of clock signal 112.

Period comparison circuit 148 is configured to compare the stored period value and the count value, and in accordance therewith generate period match signal 114. Duty cycle comparison circuit 150 is configured to compare the stored duty cycle value and the count value, and in accordance therewith generate duty cycle match signal 164.

Set-reset latch 152 is configured to receive period match signal 114 and duty cycle match signal 164, and in accordance therewith generate output signal 110.

Period update circuit 154 is configured to detect the updated period value. This detection may be accomplished by receiving the period input signal 170. Period update circuit 154 is further configured to receive period match signal 114, and in accordance therewith selectively generate period write signal 116. Period update circuit 154 may be further configured to receive a disable signal 166 and in accordance therewith selectively generate period write signal 116 independently of period match signal 114.

Duty cycle update circuit 156 is configured to detect the updated duty cycle value. This detection may be accomplished by receiving the duty cycle input signal 172. Duty cycle update circuit 156 is further configured to receive period match signal 114, and in accordance therewith selectively generate duty cycle write signal 118. Duty cycle update circuit 156 may be further configured to receive a disable signal 166 and in accordance therewith selectively generate duty cycle write signal 118 independently of period match signal 114.

Period update circuit 154 and duty cycle update circuit 156 may each be still further configured to receive a sequence signal 168 indicative of a sequence in which to detect the updated period value and the updated duty cycle value, and in accordance therewith selectively generate period write signal 116 and duty cycle write signal 118 only after detecting the updated period value and the updated duty cycle value in such sequence.

Period update circuit 154 and duty cycle update circuit 156 may be yet further configured to receive a reset signal 174. This initializes the circuits to allow processing to begin at a known set of initial conditions.

Period update circuit 154 and duty cycle circuit 156 may implement state machines. The operation of and variations on these state machines are discussed with reference to FIGS. 5–7.

Figure 5A:
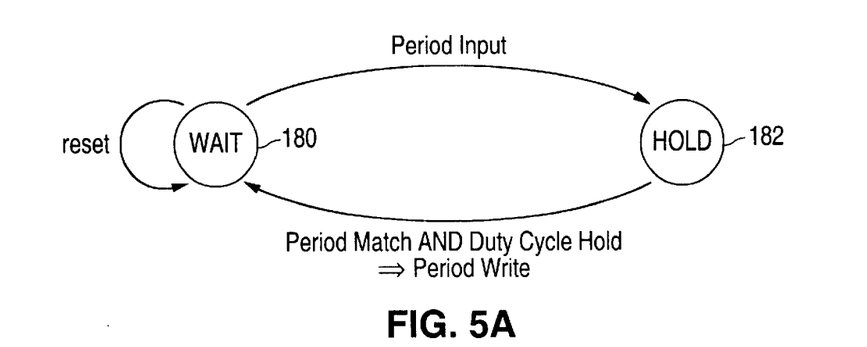
FIGS. 5A–5B are state diagrams for the PWM timer circuit of FIG. 4.
Figure 5B:
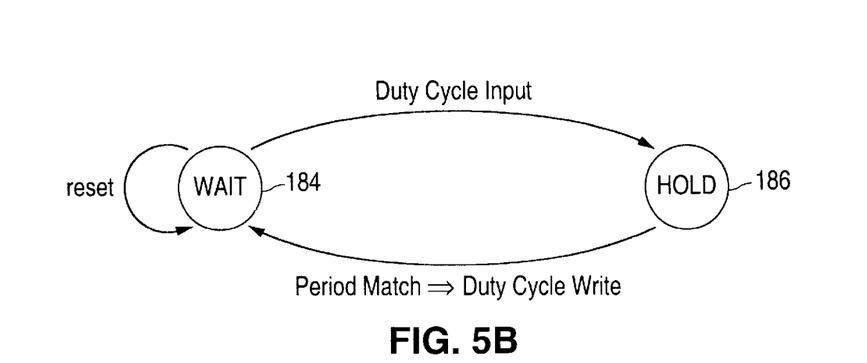

FIGS. 5A–5B show a first version of state diagrams implemented by period update circuit 154 and duty cycle update circuit 156, respectively. This first version implements a process wherein an updated duty cycle value must be supplied before an updated period value is supplied.

FIG. 5A shows the states of period update circuit 154. Initially, period update circuit 154 is in wait state 180. It remains in wait state 180 upon a reset or when period input signal 170 is false. Upon period input signal 170 becoming true, it transitions to hold state 182. It remains in hold state 182 until period match signal 114 is true and duty cycle update circuit 156 is in a hold state 186. It then generates period write signal 116 and transitions back to wait state 180.

FIG. 5B shows the states of duty cycle update circuit 156. Initially, duty cycle update circuit 156 is in wait state 184. It remains in wait state 184 upon a reset or when duty cycle input signal 172 is false. Upon duty cycle input signal 172 becoming true, it transitions to hold state 186. It remains in hold state 186 until period match signal 114 is true. It then generates duty cycle write signal 118 and transitions back to wait state 184.

When counter 104 is configured to receive disable signal 166, this adds an optional condition for updating the registers 142 and 146 from the shadow registers 140 and 144. The transition from wait state 180 or 184 to hold state 182 or 186, respectively, is the same as in FIGS. 5A–5B. However, the transition from period hold state 182 to period wait state 180 may also occur if the disable signal 166 is true. Similarly, the transition from duty cycle hold state 186 to duty cycle wait state 184 may also occur if the disable signal 166 is true. In other words, the update sequencer circuit 108 will generate the write signal 116 or 118 one clock cycle after receiving the input signal 170 or 172, respectively, to update the respective register 142 or 146, regardless of the period match and the state of the other machine. The input signal 170/172 updates the shadow register 140/144 with the updated value and the write signal 116/118 updates the register 142/146 from the shadow register 140/144.

When counter 104 is configured to receive timer signal 162, this adds an optional condition for transitioning from the hold state to the wait state for both FIGS. 5A–5B. When timer signal 162 is false, counter 104 stops counting. As before, assertion of the period input signal 170 or the duty cycle input signal 172 will load the respective shadow registers 140 and 144, and will transition to the respective hold states 182 and 186. However, once in the respective hold state 182 or 186, the update sequencer circuit 108 will not wait for the period match signal 114, because this will not occur when the counter 104 is stopped. Instead, on the next clock cycle, the update sequencer circuit 108 will transition from the hold state to the respective wait state 180 or 184, and will generate the respective write signal 116 or 118. Thus, the respective shadow register 142 or 146 will be updated independently of the period match.

If the timer signal 162 becomes false when update sequencer circuit 108 is already in hold state 182 or hold state 186, the update sequencer circuit 108 will generate the respective write signal 116 or 118 and will transition from the hold state to the respective wait state 180 or 184 on the next clock cycle. This avoids the case where a pending register write might be lost or delayed if the counter is stopped and restarted.

Figure 6A:
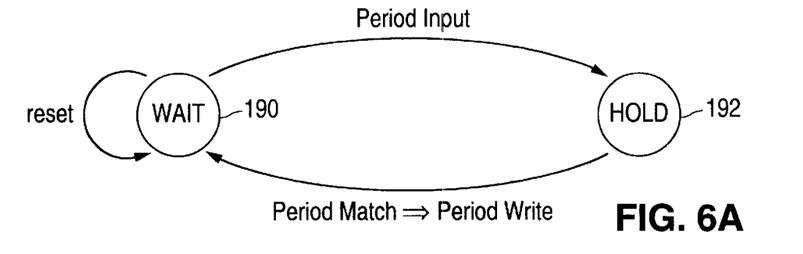
FIGS. 6A–6B are alternative state diagrams for the PWM timer circuit of FIG. 4.
Figure 6B:
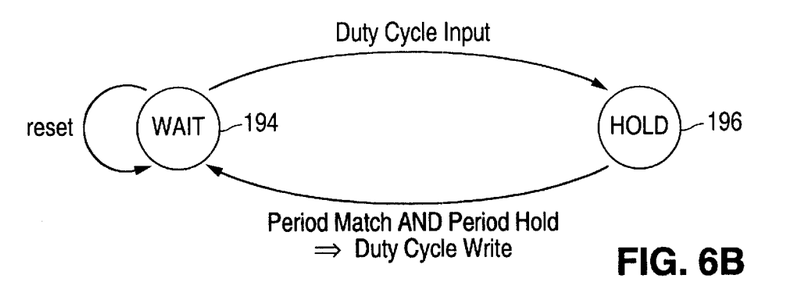

FIGS. 6A–6B show a second version of state diagrams implemented by period update circuit 154 and duty cycle update circuit 156, respectively. These figures correspond to FIGS. 5A–5B, with the change that the updated period value must be supplied before the updated duty cycle value is supplied.

More specifically, period update circuit 154 begins in wait state 190. It remains in wait state 190 upon a reset or when period input signal 170 is false. Upon period input signal 170 becoming true, it transitions to hold state 192. It remains in hold state 192 until period match signal 114 is true. It then generates period write signal 116 and transitions back to wait state 190.

Similarly, duty cycle update circuit 156 begins in wait state 194. It remains in wait state 194 upon a reset or when duty cycle input signal 172 is false. Upon duty cycle input signal 172 becoming true, it transitions to hold state 196. It remains in hold state 196 until period match signal 114 is true and period update circuit 154 is in a hold state 192. It then generates duty cycle write signal 118 and transitions back to wait state 194.

Figure 7A:
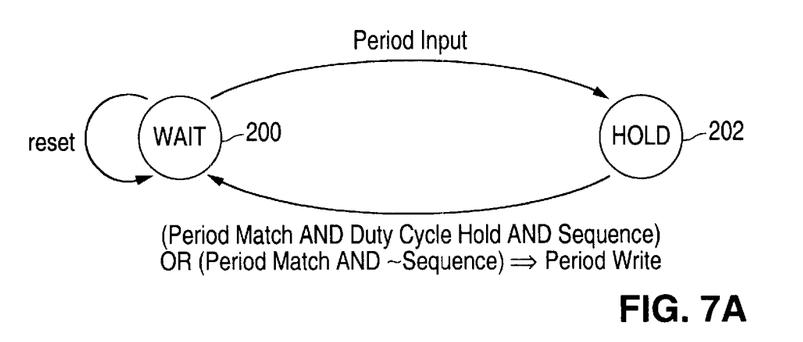
FIGS. 7A–7B are further alternative state diagrams for the PWM timer circuit of FIG. 4.
Figure 7B:
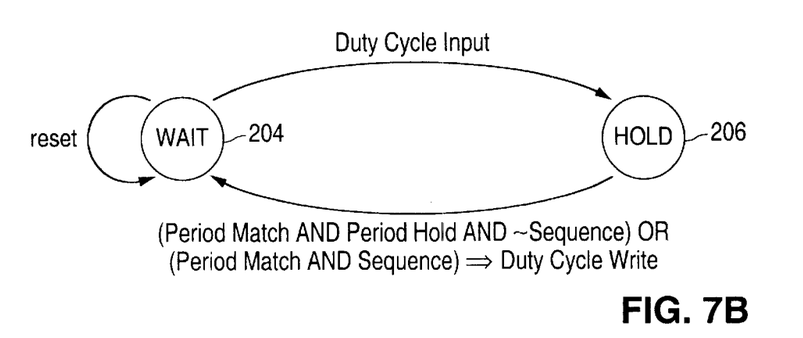

FIGS. 7A–7B show a third version of state diagrams implemented by period update circuit 154 and duty cycle update circuit 156, respectively. This third version implements a process wherein the sequence signal 168 determines the order in which the updated duty cycle value and the updated period value must be supplied. Specifically, FIGS. 7A–7B illustrate the situation where the sequence signal 168 being false signifies the duty cycle value is to be received before the period value; and the sequence signal 168 being true signifies the period value is to be received before the duty cycle value.

In FIG. 7A, period update circuit 154 begins in wait state 200. It remains in wait state 200 upon a reset or when period input signal 170 is false. Upon period input signal 170 becoming true, it transitions to hold state 202. It remains in hold state 202 until either (1) period match signal 114 is true, duty cycle update circuit 156 is in a hold state 206, and sequence signal 168 is true, or (2) period match signal 114 is true and sequence signal 168 is false. It then generates period write signal 116 and transitions back to wait state 200.

In FIG. 7B, duty cycle update circuit 156 begins in wait state 204. It remains in wait state 204 upon a reset or when duty cycle input signal 172 is false. Upon duty cycle input signal 172 becoming true, it transitions to hold state 206. It remains in hold state 206 until either (1) period match signal 114 is true, period update circuit 154 is in a hold state 202, and sequence signal 168 is false, or (2) period match signal 114 is true and sequence signal 168 is true. It then generates duty cycle write signal 118 and transitions back to wait state 204.

In summary, the present invention uses update sequencer circuit 108 to solve the problems of existing PWM signal generation systems. This eliminates the requirement for the software to have a polling loop or an interrupt. The software can provide the updated period value and updated duty cycle value to PWM timing circuit 100 independently of synchronization with the PWM timing circuit. This increases the overhead of the software and reduces the load on the processor, increasing the performance of the PWM signal generation system.

It should be understood that various alternatives to the embodiments of the invention described herein may be employed in practicing the invention. It is intended that the following claims define the scope of the invention and that structures within the scope of these claims and their equivalents are covered thereby.

What is claimed is:

1. An apparatus including a pulse width modulation (PWM) timing circuit for generating a signal having a programmable period and a programmable duty cycle, comprising:

a storage element configured to store at least a period value and a duty cycle value;

a counter configured to receive a clock signal and in accordance therewith generate a count value;

a comparison circuit, coupled to said storage element and said counter, said comparison circuit configured to compare said count value, said period value, and said duty cycle value, and in accordance therewith generate a period match signal and an output signal; and an update sequencer circuit, coupled to said storage element and said comparison circuit, said update sequencer circuit configured to detect an updated period value and an updated duty cycle value, and to receive said period match signal, and in accordance therewith selectively generate a period write signal and a duty cycle write signal, wherein said storage element is further configured to receive said updated period value, said updated duty cycle value, said period write signal, and said duty cycle write signal, and in accordance therewith replace said period value with said updated period value and said duty cycle value with said updated duty cycle value.

2. The apparatus of claim 1, wherein said storage element comprises:

a period shadow register configured to receive a period input signal and said updated period value, and in accordance therewith store said updated period value;

a period register, coupled to said period shadow register, said period register configured to store said period value, and to receive said updated period value and said period write signal, and in accordance therewith replace said period value with said updated period value;

a duty cycle shadow register configured to receive a duty cycle input signal and said updated duty cycle value, and in accordance therewith store said updated duty cycle value; and a duty cycle register, coupled to said duty cycle shadow register, said duty cycle register configured to store said duty cycle value, and to receive said updated duty cycle value and said duty cycle write signal, and in accordance therewith replace said duty cycle value with said updated duty cycle value.

3. The apparatus of claim 1, wherein said comparison circuit comprises:

a period comparison circuit configured to compare said period value and said count value, and in accordance therewith generate said period match signal;

a duty cycle comparison circuit configured to compare said duty cycle value and said count value, and in accordance therewith generate a duty cycle match signal; and a periodic signal generation circuit, coupled to said period comparison circuit and said duty cycle comparison circuit, said period signal generation circuit configured to receive said period match signal and said duty cycle match signal, and in accordance therewith generate said output signal.

4. The apparatus of claim 1, wherein said update sequencer circuit comprises:

a period update state machine configured to detect said updated period value, and to receive said period match signal, and in accordance therewith generate said period write signal; and a duty cycle update state machine configured to detect said updated duty cycle value, and to receive said period match signal, and in accordance therewith generate said duty cycle write signal.

5. The apparatus of claim 4, wherein:

said period update state machine is further configured to transition between at least two states, including a period wait state and a period hold state, and is still further configured to transition from said period wait state to said period hold state in accordance with said period input signal, and to transition from said period hold state to said period wait state in accordance with said period match signal and in accordance therewith generate said period write signal; and said duty cycle update state machine is further configured to transition between at least two states, including a duty cycle wait state and a duty cycle hold state, and is still further configured to transition from said duty cycle wait state to said duty cycle hold state in accordance with said duty cycle input signal, and to transition from said duty cycle hold state to said duty cycle wait state in accordance with said period match signal and in accordance therewith generate said duty cycle write signal.

6. The apparatus of claim 1, wherein:

said update sequencer circuit is further configured to receive a disable signal and in accordance therewith selectively generate said period write signal and said duty cycle write signal independently of said period match signal.

7. The apparatus of claim 1, wherein:

said update sequencer circuit is further configured to receive a sequence signal indicative of a sequence in which to detect said updated period value and said updated duty cycle value, and in accordance therewith selectively generate said period write signal and said duty cycle write signal only after detecting said updated period value and said updated duty cycle value in said sequence.

8. The apparatus of claim 7, further comprising:

a computer program embodied on a computer-readable medium, said computer program configured to transmit, independently of synchronization with said PWM timing circuit, said updated period value and said updated duty cycle value to said storage element.

9. The apparatus of claim 1, further comprising:

a computer program embodied on a computer-readable medium, said computer program configured to transmit, independently of synchronization with said PWM timing circuit, said updated period value and said updated duty cycle value to said storage element.

10. A method of generating a signal having a programmable period and a programmable duty cycle, comprising the steps of:

storing at least a period value and a duty cycle value;

generating a count value in response to a clock signal;

generating a period match signal and a duty cycle match signal by comparing said count value, said period value, and said duty cycle value, and generating an output signal in response to the period match signal and the duty cycle match signal;

detecting an updated period value and an updated duty cycle value;

generating a period write signal and a duty cycle write signal in accordance with said updated period value, the updated duty cycle value, and the period match signal, such that generation of at least one of the period write signal and the duty cycle write signal is delayed until both the updated period value and the updated duty cycle value have been detected and the period match signal has been generated; and replacing said period value with said updated period value in response to the period write signal and said duty cycle value with said updated duty cycle value.

11. The method of claim 10, further comprising the step of:

receiving a sequence signal indicative of a sequence in which to detect said updated period value and said updated duty cycle value, wherein generation of one of the period write signal and the duty cycle write signal is delayed until both the updated period value and the updated duty cycle value have been detected and the period match signal has been generated, and said one of the period write signal and the duty cycle write signal is determined by the sequence signal.

12. The method of claim 10, wherein generation of one but not both of the period write signal and the duty cycle write signal is delayed until both the updated period value and the updated duty cycle value have been detected and the period match signal has been generated.

* * * * *

UNITED STATES PATENT AND TRADEMARK OFFICE
CERTIFICATE OF CORRECTION

PATENT NO.   : 6,487,246 B1
DATED        : November 26, 2002
INVENTOR(S)  : Wolfgang K. Hoeld It is certified that error appears in the above-identified patent and that said Letters Patent is hereby corrected as shown below:

<u>Column 8,</u>
Line 1, "period" should be -- periodic --.

Signed and Sealed this

Twenty-fifth Day of February, 2003

JAMES E. ROGAN
*Director of the United States Patent and Trademark Office*